United States Patent
McLachlan et al.

(10) Patent No.: US 7,015,847 B1
(45) Date of Patent: Mar. 21, 2006

(54) DIGITAL TO ANALOG CONVERTER

(75) Inventors: Roderick C. McLachlan, Edinburgh (GB); Gavin P. Cosgrave, Enniscorthy (IE); Roger C. Peppiette, Edinburgh (GB); Geoffrey T. Haigh, Boxford, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/056,876

(22) Filed: Feb. 11, 2005

(51) Int. Cl.
*H03M 1/66* (2006.01)
(52) U.S. Cl. ............................ 341/145; 341/144
(58) Field of Classification Search ............... 341/144, 341/145, 154, 118, 122
See application file for complete search history.

(56) References Cited

U.S. PATENT DOCUMENTS

| | | | |
|---|---|---|---|
| 4,491,825 A | 1/1985 | Tuthill | |
| 5,396,245 A | 3/1995 | Rempfer | |
| 5,563,541 A * | 10/1996 | Koga et al. | 327/380 |
| 5,969,657 A | 10/1999 | Dempsey et al. | |
| 6,163,288 A * | 12/2000 | Yoshizawa | 341/144 |
| 2002/0041245 A1 * | 4/2002 | Brownlow et al. | 341/145 |
| 2005/0168365 A1 * | 8/2005 | Kaplan | 341/143 |

* cited by examiner

*Primary Examiner*—Peguy JeanPierre
(74) *Attorney, Agent, or Firm*—Wolf, Greenfield & Sacks, P.C.

(57) ABSTRACT

A sub-ranging DAC converter is provided where voltage followers rather than operational amplifiers are used to avoid loading a main resistor string.

27 Claims, 17 Drawing Sheets

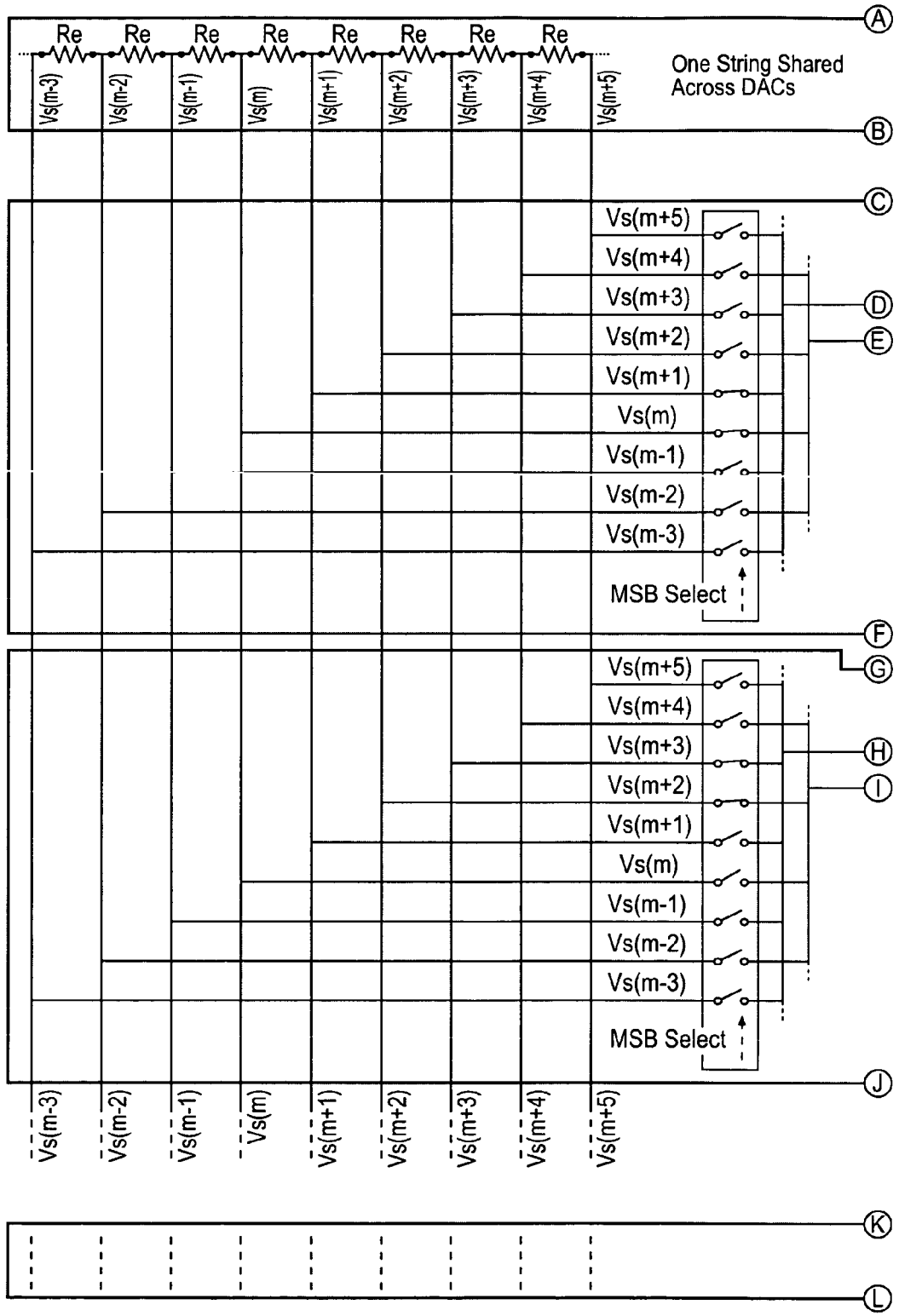
Fig. 7 (continued on page 8/17)

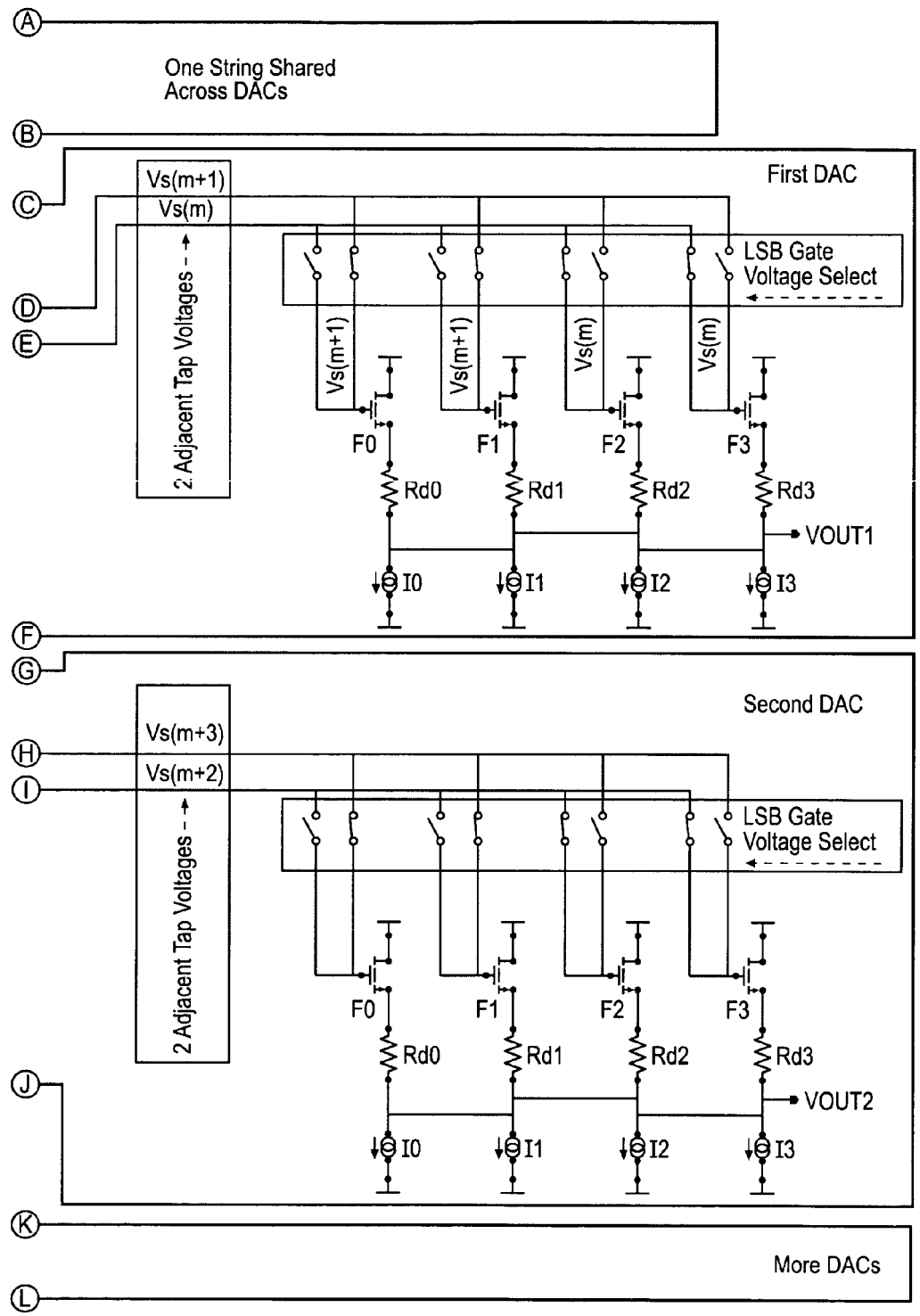
Fig. 7 (continued from page 7/17)

DIGITAL TO ANALOG CONVERTER

FIELD OF THE INVENTION

The present invention relates to a digital to analog converter. Such a converter comprises a main converter and a sub-ranging converter such that high resolution can be achieved without requiring exceptionally complex fabrication processes or large numbers of components.

BACKGROUND OF THE INVENTION

In general, there is a desire to provide digital to analog converters having increased resolution whilst also maintaining good differential non-linearity and good integral non-linearity. Typically a digital to analog converter comprises a chain 2 of series connected resistors as shown in FIG. 1. In this example the chain comprises N resistors labelled $R_1$ to $R_N$. The chain extends between two terminals labelled "VREFGND" which is typically held at a ground voltage and "VREF" to which a reference voltage is applied. The resistor chain 2 forms a resistive divider such that, if the resistors are of equal size, then the voltage occurring between resistor $R_1$ and $R_2$ is $$\frac{1}{N}$$

of the reference voltage, the voltage at the node formed between $R_2$ and $R_3$ is $$\frac{2}{N}$$

of the reference voltage and so on. These voltages are designated $V_S(0)$ to $V_S(N)$ in FIG. 1. A selector system, generally designated 4 comprises a series of switches S0 to SN each associated with a respective one of the nodes. A control unit (not shown) receives a word which is to be converted to an analog voltage. The control unit decodes the word to select only one of the switches S0 to SN which is to be closed thereby connecting an appropriate node of the resistor chain 2 to the output node $V_{OUT}$.

Several years ago digital to analog converters having 8-bit resolution were considered to be adequate. This required the formation of $2^8$ (or more accurately $2^8-1$) resistors, hence 255 resistors were required to make the resistor chain to provide a output ranging between $$\frac{0}{255}$$

and $$\frac{255}{255}$$

$V_{ref}$ inclusive. However, to provide an extra 4-bits of resolution to give a 12-bit converter means that the number of resistors in the resistor chain increases approximately 16 fold to 4095. This significantly increases the size of the digital to analog converter on the semiconductor die hence resulting in a much more expensive component. Provision of even higher resolution digital to analog converters becomes increasingly difficult.

It is known to provide sub-ranging converters in order to increase the resolution of the converter without paying such a heavy penalty in component count. An example of such a device is disclosed in U.S. Pat. No. 4,491,825 in which a resistor string digital to analog converter forming a primary converter is tapped, at adjacent taps to provide inputs to a further sub-ranging converter which is formed as an R2R ladder. This arrangement works well. However it is necessary to provide buffers between the primary converter and the sub-ranging converter and these buffers take up significant space on the silicon die and can introduce offset errors and other potential non-linearities. Other schemes are known, such as that described in U.S. Pat. No. 5,969,657 which is a dual string digital to analog converter in which the least significant bit string loads the most significant bit string in a code dependent manner. This means the changing the most significant bit code alters the loading on the most significant bit string and the voltage at the taps on the string.

A further arrangement is described in U.S. Pat. No. 5,396,245 which has a converter divided into a most significant bit (MSB) subword decoder and a least significant bit (LSB) subword decoder. The MSB decoder is formed as a tapped resistor string and the MSB word selects adjacent taps for output lines. These are provided to the LSB decoder which is fabricated as a multi-input operational amplifier. The individual inputs are selectively switchable to either of the two output lines from the MSB decoder in accordance with the LSB word. Whilst this circuit works effectively for a single digital to analog converter, it should be noted that the input stages of each opamp capacitively loads the most significant bit string and consequently an attempt to share the most significant bit string between multiple subword decoders (sub-ranging converters) results in cross talk between the digital to analog converters.

SUMMARY OF THE INVENTION

According to a first aspect of the present invention there is provided a digital to analog converter, comprising:
  a first digital to analog converter for producing first and second outputs in response to a demand word; and
  at least one sub-ranging digital to analog converter having first and second inputs responsive to signals produced by the first and second outputs of the first digital to analog converter;

wherein the at least one sub-ranging digital to analog converter comprises 1 to N voltage follower transistors, each voltage follower transistor having:
  a) a respective first terminal connected to a shared output node; and
  b) a respective control terminal which is selectively connectable to the first input or to the second input.

It is thus possible to provide a digital to analog converter in which the or each sub-ranging converter uses voltage followers so as to prevent the sub-ranging converters from loading the primary converter string. This allows the primary converter string to be shared between many sub-ranging converters, thereby allowing a multi-channel digital to analog converter to be fabricated more economically.

Preferably each transistor has a respective second terminal connected to a voltage source.

Preferably the output node of each voltage follower has current defining device, such as a current source (or current sink) connected to it such that current flowing through the voltage follower is well defined irrespective of the digital word which is being converted into an analog value. Alternatively, given that the outputs of the followers are connected to a common node then a single current sink or current source can be shared between the followers in a single sub-ranging converter.

Preferably each follower comprises an insulated gate field effect transistor thereby ensuring that it presents a high impedance to the primary converter string.

Where the transistors are field effect transistors then the first terminal corresponds to the source of the transistor, the second terminal is the drain of the transistor and the control terminal is the gate of the transistor.

Preferably each voltage follower transistor has a resistor connected between its first terminal and the shared output node. This resistor helps to linearise the performance of the sub-ranging converter.

The resistors may be substantially equal in value such that, given a first voltage on the first input of the sub-ranging digital to analog converter and a second voltage on the second input of the sub-ranging digital to analog converter each of the 1 to N transistors pass substantially the same current when connected to a given one of the inputs. In such an arrangement the control word for the sub-ranging converter is decoded in a "thermometer" style However, in an alternative configuration the resistors may vary in a predetermined way such that some of transistors pass more current than others. Thus the contributions from the transistors need no longer be equal. Preferably, if one of the resistors has an arbitrary value of 1 then the other resistors are related to it such that their resistance $R=A^B$ where A (a radix) is a constant (but not necessarily an integer) and B is selected from a sequence of integers or is an inverse of the sequence of integers. In a preferred embodiment A has the value of 2 such that resistors form part of a binary weighted sequence. However preferably additional resistors corresponding to selected binary weights are also included so as to provide redundancy within the subconverter.

Thus, if the resistors are selected to have a value of R, $$\frac{R}{2}, \frac{R}{4}, \frac{R}{8}, \frac{R}{16}$$

and $$\frac{R}{32}$$

then the outputs of the transistors will be I, 2I, 4I, 8I, 16I and 32I where a arbitrary reference current is designated I. However if redundant components are included then the value of the resistors may follow the sequence $$R, R, \frac{R}{2}, \frac{R}{4}, \frac{R}{8}, \frac{R}{8}, \frac{R}{16}.$$

Thus the relative weights of the resistors are nominally determined in accordance with a binary sequence even if the sequence itself is not strictly a binary one. It is, however, important that the sequence can be counted up in a monotonic manner without missing any steps.

Preferably the length to width ratio of the conducting channel of each FET is scaled in proportion to the value of the nominal value of the associated resistor such that, for the respective current, each FET has the same gate source voltage $V_{GS}$.

Advantageously a voltage stabilisation circuit is provided for at least some of the voltage follower transistors to reduce the variation in the drain source voltage that occurs across the 1 to N follower transistors that results from different first and second output voltages from the first digital to analog converter in response to the demand word.

Each follower transistor may have its own stabilisation circuit. However, to conserve space and to reduce complexity, the voltage stabilisation circuit is preferably shared by each transistor in a given sub-ranging digital to analog converter. Advantageously the 1 to N follower transistors have their drain terminal connected to a common node and the voltage at that node is a function of a voltage at the shared output node.

Preferably the first digital to analog converter has a first input terminal for accepting a first voltage reference VR1 and a second input terminal for accepting a second voltage reference VR2 which define the limits of the voltages that the first digital to analog converter can output.

The voltage followers introduce a voltage offset and consequently, in order to remove this voltage offset further voltage followers may either be interposed in a feedback loop of a buffer amplifier which buffers the output of the sub-ranging digital to analog converter or, alternatively, a compensating voltage offset can be introduced into the first digital to analog converter using voltage follower transistors similar to those in the sub-ranging converter. In an embodiment of the invention voltage followers may be interposed between the first input VR1 and the second input VR2 of the digital to analog converter.

BRIEF DESCRIPTION OF THE DRAWINGS

The present invention will further be described, by way of example, with reference to the accompanying drawings, in which:

FIG. 7 is a schematic diagram of a multi-channel DAC constituting an embodiment of the present invention;

DESCRIPTION OF PREFERRED EMBODIMENTS

Figure 1:
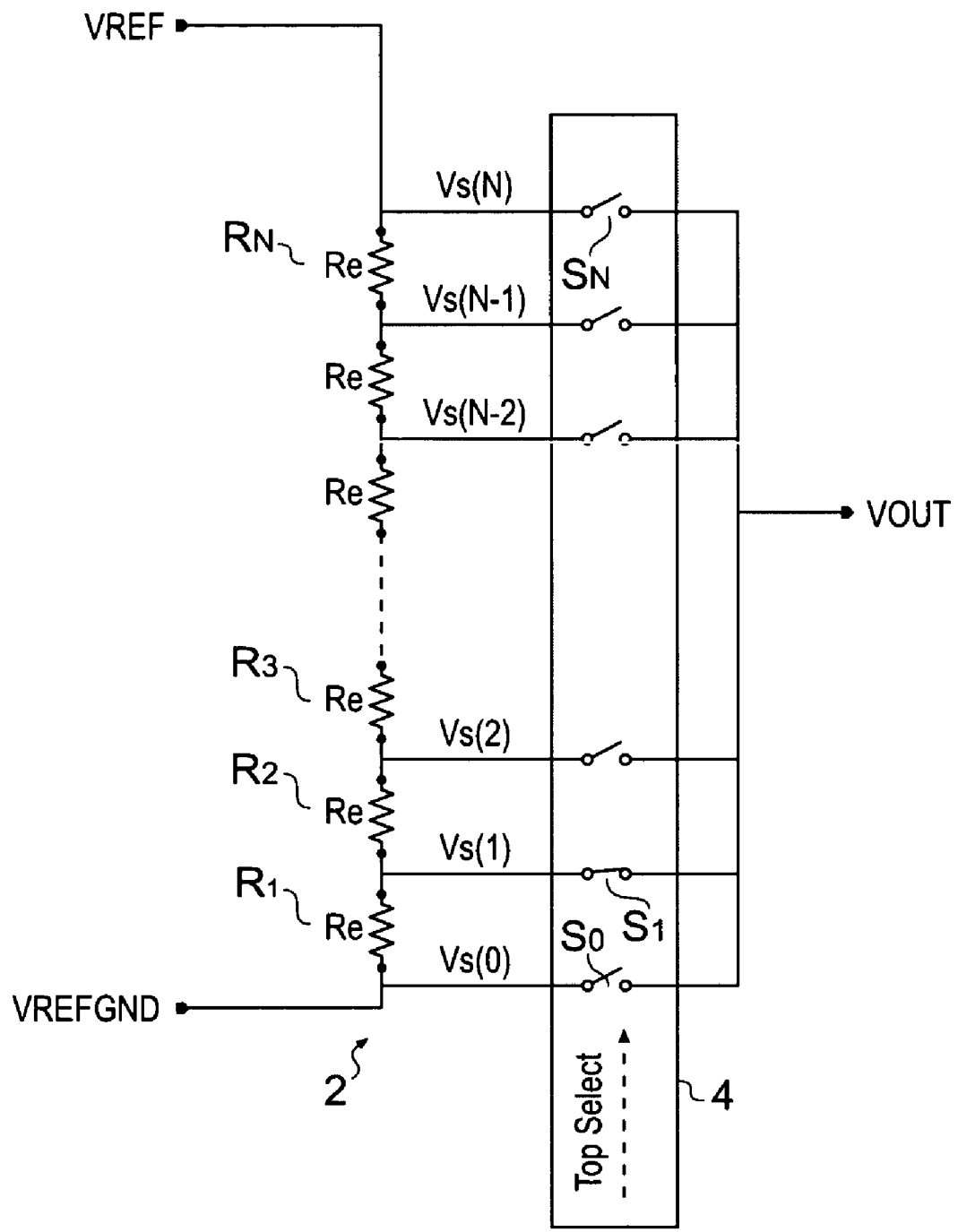
FIG. 1 schematically illustrates a resistor string digital to analog converter.
Figure 2:
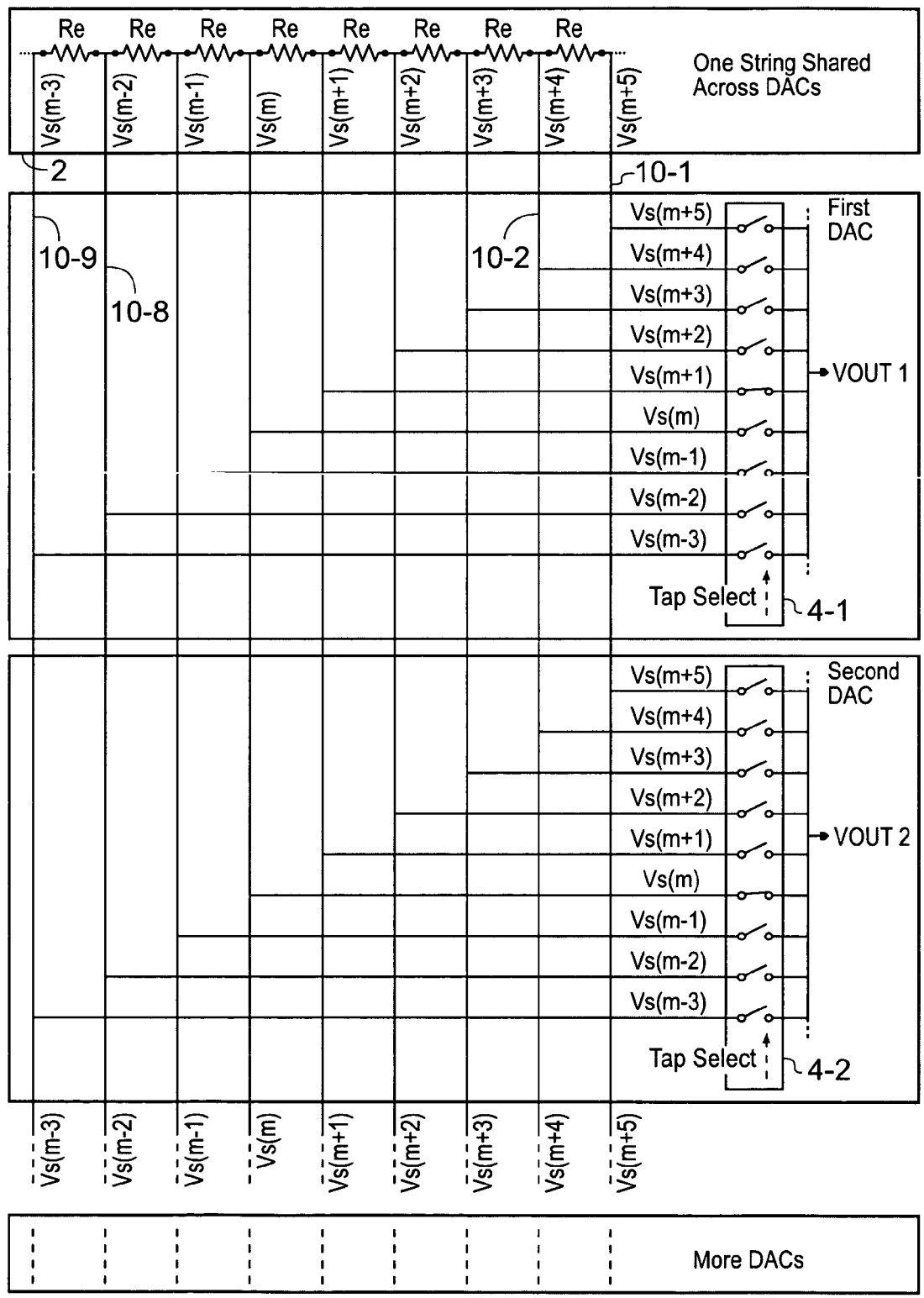
FIG. 2 schematically illustrates a multi-channel digital to analog converter.

As noted earlier, there is a financial advantage to be had in being able to share a resistor string between multiple digital to analog converters. Such an arrangement is schematically illustrated in FIG. 2. Here a resistor string, of the type which is shown in FIG. 1, is generally designated 2. A connection is made to each node between adjacent resistors, these connections being designated 10-1 to 10-9 in FIG. 2 although in general there will be further connections. A plurality of selection units of the type shown in FIG. 1 are also provided and these are designated 4-1, 4-2 and so on and each selection unit 4-1 and 4-2 can be independently controlled to connect its respective output VOUT1, VOUT2 and so on to a selected one of the connections 10-1 to 10-9 thereby causing the output voltages to be independently selectable and for multiple digital to analog converters to share a single resistor string 2. However, each output VOUT1 and VOUT2 can load the string 2 and hence can seriously perturb the operation of each digital to analog converter connected to the string 2.

In order to overcome this potential problem, each output should be provided to a high impedance device. Hitherto this has been by the formation of buffer amplifiers. Whilst this is effective, each buffer amplifier takes up a relatively large space on the silicon die of the integrated circuit. The inventors have realised that similar isolation of the resistor string 2 from the loads connected to it via the selectors 4 can be achieved using a voltage follower circuit.

The use of a voltage follower is counter intuitive since it will necessarily introduce a voltage offset and the introduction of offsets are undesirable generally, and especially so in the context of high precision digital to analog converters.

Figure 3:
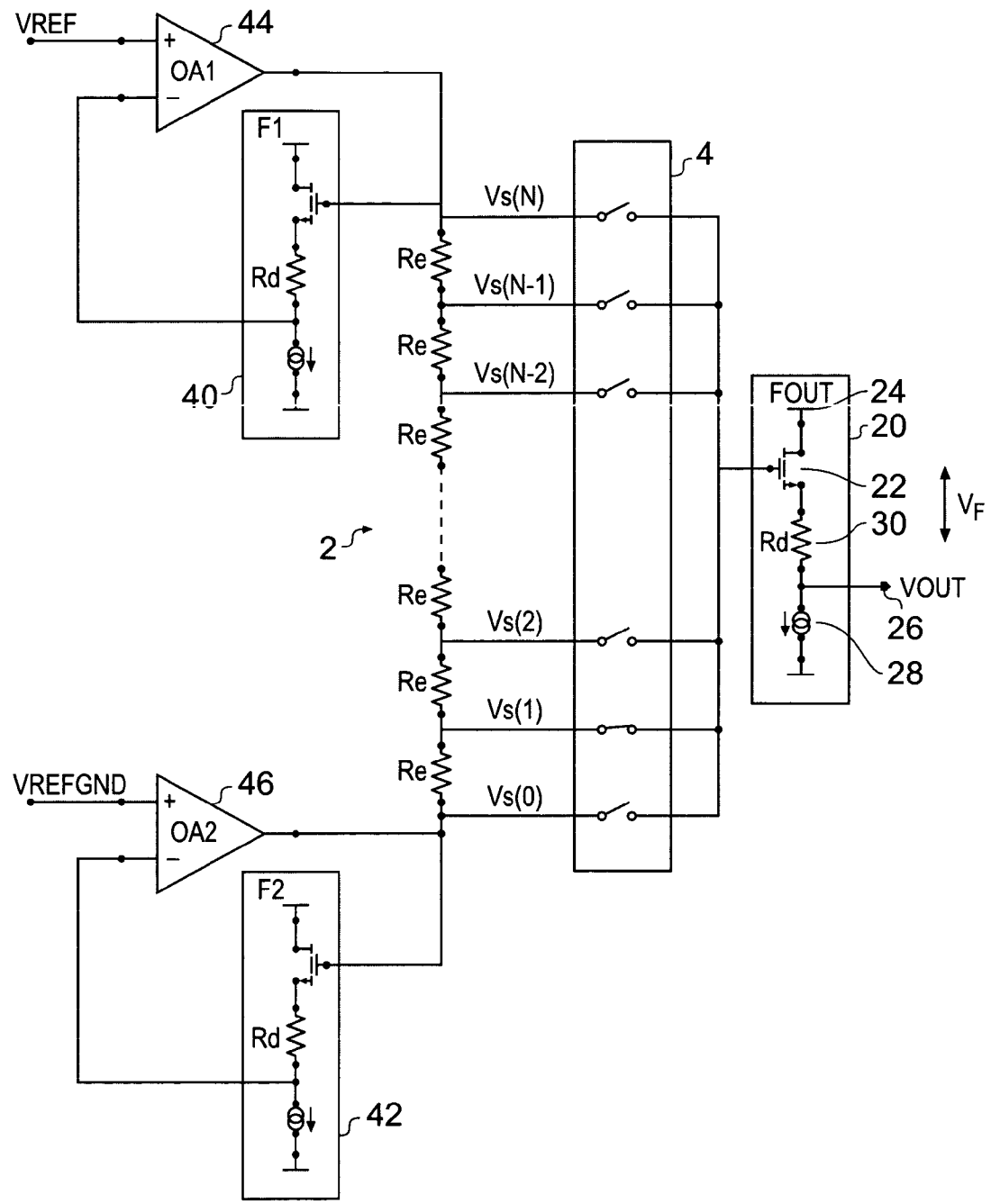
FIG. 3 is a schematic diagram of a digital to analog converter constituting an embodiment of the present invention.

FIG. 3 is a schematic diagram of a digital to analog converter. The diagram has been simplified in order to aid explanation of the circuit and consequently only one digital to analog converter selection unit 4 is illustrated as being connected to the resistor string 2. In practice further selection units 4 would be provided such that the converter has multiple outputs.

In this arrangement a voltage follower, generally designated 20, is connected so as to receive the output of the selection circuit 4. The voltage follower 20 comprises an NMOS field effect transistor having its drain connected to a positive supply 24 which would typically be a positive supply rail within the converter, although as would be explained later this need not always be the case. A gate of the transistor 22 is connected to the output of the selector 4. A source of the transistor 22 is connected to an output node 26. The source of the transistor 22 needs to see a negative voltage with respect to the drain and, in this example, this is achieved by the provision of a current sink 28 which is in series connection between the source and a negative supply rail. The current sink is, in this example provided by an active component, such as a transistor of a current mirror pair, although it could also be provided by a resistor although this is not so likely within the context of an integrated circuit. Advantageously, though not necessarily, a resistor 30 is provided in series connection with the source of the transistor 22, and is interposed between the transistor 22 and the current sink 28.

The transistor 22 within the follower 20 is self biased and advantageously is fabricated such that its back gate (not shown) is connected to its source or to the node formed between the resistor 30 and the current sink 28. This is ensures that the voltage threshold of the transistor 22 remains constant, thereby improving accuracy within the digital to analog converter.

For good performance the voltage follower transistor should have a low threshold voltage temperature coefficient. This becomes important in circuits were multiple voltage followers are provided, as in the case in FIG. 3, such that even if the voltage followers are not thermally matched there will not be a significant offset error in the performance of the digital to analog converter. The level shift provided by the voltage follower 20 is composed of a voltage drop across the resistor 30 by virtue of the current flowing through it, and a voltage drop occurring across the transistor 22. The voltage shift across the transistor 22 is a function of the gate-source voltage of the transistor and this is formed of two components, one due to the FET threshold voltage of the transistor and one due to the carrier mobility within the transistor. These components generally have an opposite sign and therefore can be partially cancelled although this does require an understanding of the temperature dependence of threshold voltage and mobility within an MOS device. However, the temperature coefficient of the FET threshold voltage is normally quite linear whereas the temperature coefficient of mobility is highly non-linear. This makes it difficult or impossible to cancel the two components accurately over a large temperature range. Nevertheless, it is possible to manufacture devices with reduced temperature coefficients by changing the substrate doping concentration used within the device.

Nevertheless, it will be seen that a voltage drop VF occurs between the input to the voltage follower and the output of the voltage follower. However, in order to compensate for this it is possible to raise the voltages occurring at opposing ends of the resistor string 2 by VF such that, overall, no voltage shift occurs. This can be done by including further voltage followers 40 and 42 having a construction identical, within practical limits, to that of the voltage follower 20 preferably, but not necessarily, within feedback loops of buffer amplifiers 44 and 46. The operation of the circuits at either end of the resistor string is the same and consequently only one needs to be described. Consider the operation of amplifier 46. A ground voltage is applied to the non-inverted input of the amplifier 46. The amplifier 46 is included within the feedback loop and the combined operation of the amplifier and the feedback loop is such that the output of the amplifier will take whatever voltage is appropriate to cause the voltage at the inverting input of the amplifier 46 to match the voltage at the non-inverting input of the amplifier 46. Therefore we can see that the inverting input will tend towards the voltage of zero volts, i.e. the same as that provided to the non-inverting input. In order for the inverting input to attain zero volts the voltage at the input to the gate of the voltage follower 42 must be $V_F$ and consequently the voltage at the low voltage end of the resistor chain 2 is $V_F$. Similar analysis reveals that the voltage occurring at the high voltage end of the resistor chain 2 will be $V_{REF}$ plus $V_F$. Therefore the effective voltage occurring across the resistor chain 2 is lifted by a value $V_F$ and this matches and counteracts for the reduction of output voltage by $V_F$ occurring in the voltage follower 20 at the output of the selection unit 4.

Some fabrication processes allow for the fabrication of so-called "native" devices with low substrate doping concentrations. A "native" device has a deliberately different MOS channel doping to create a lower voltage threshold. Such transistors are normally unsuitable for use in digital circuits but can have great use in analog circuits. "Native" transistors can be expected to have a lower temperature coefficient of threshold voltage. This allows fabrication cost to be traded for greater analog performance. However, in general the present invention allows good analog performance to be maintained with transistors fabricated as NMOS transistors using a fabrication process which is good for the formation of digital circuits, and hence widely available and relatively inexpensive.

Figure 4:
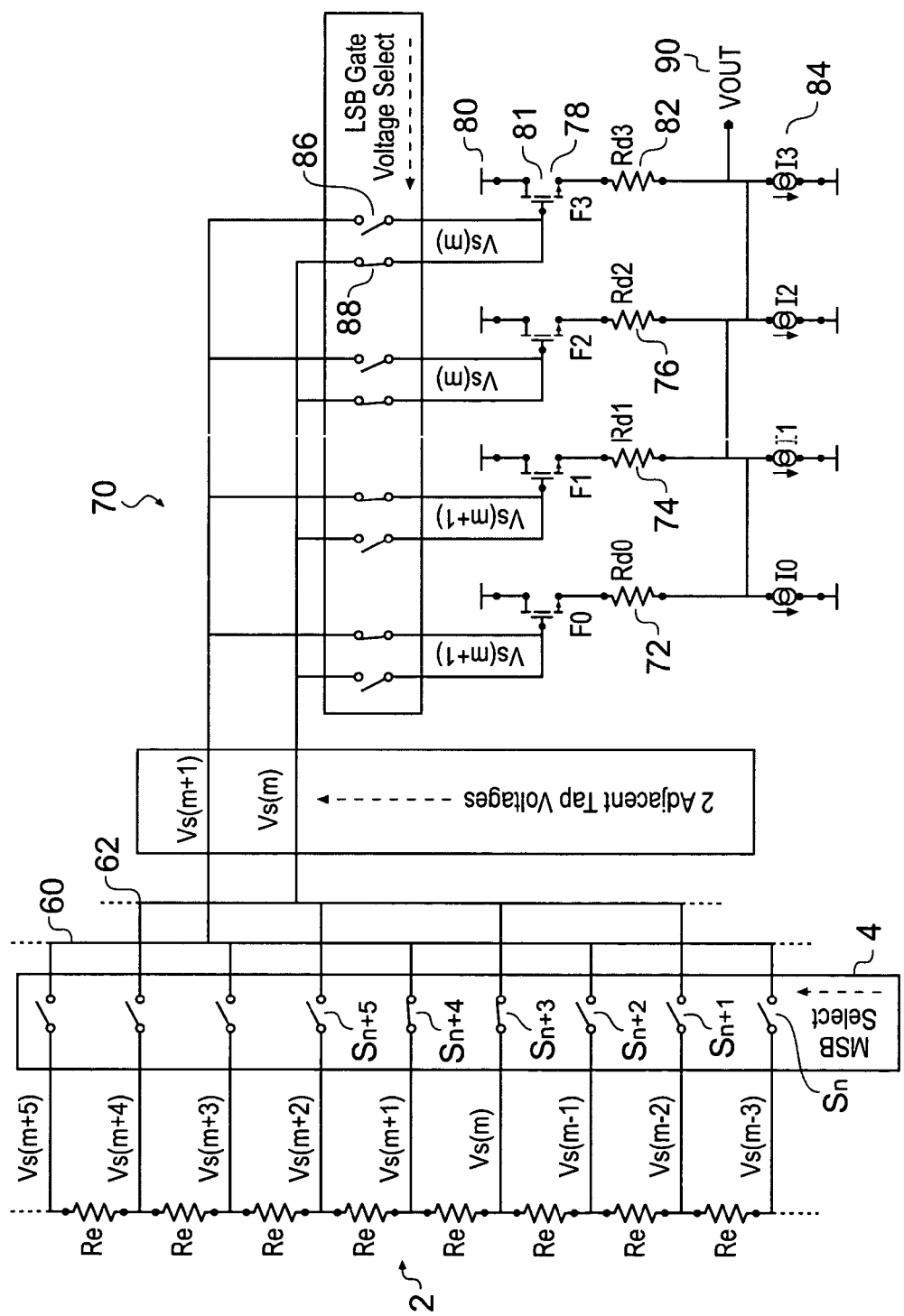
FIG. 4 is a schematic diagram of a digital to analog converter having a primary converter and a sub-ranging converter with voltage followers and constituting an embodiment of the present invention.

The principle of the circuit showing in FIG. 3 can be extended to provide a digital to analog converter with sub-ranging. Such an arrangement is shown in FIG. 4. For convenience, the level shifting arrangements at either ends of the resistor string 2 have been omitted for clarity.

In the arrangement shown in FIG. 4 the resistor string remains as described hereinbefore. However the selection unit 4 is modified such that it has two output paths 60 and 62 with each alternate electrically controllable switch being connected to alternating ones of the output lines 60 and 62. Thus, if FIG. 4 is taken to be showing a selection of resistors and switches from a much longer resistor chain and longer selection unit 4 then, arbitrary numbered switch N is connected to the output line 60, switch N+1 is connected to the output line 62, switch N+2 is connected to the output line 60, switch N+3 is connected to the output line 62, and so on. Thus in this scheme even numbered switches are connected to one of the output lines, for example 60, whereas odd numbered switches are connected to the other output line, 62. In the arrangement shown in FIG. 4 the switches SN, $S_{N+1}$, $S_{N+2}$, $S_{N+3}$ and so on are connected to the sequential nodes in the resistor chain 2 such that if sequentially numbered switches are closed (or the other remaining switches remaining open) then the voltages on the output lines 60 and 62 are the voltages occurring at either end of a selected one of the resistors in the resistor chain 2. It should be noted at this point that although the arrangement shown in FIG. 4 is advantageous for its simplicity, other arrangements are possible and further switches could be provided such that a voltage occurring at any one of the nodes between the resistors and resistor chain can be placed on either of the output lines 60 and 62. Similarly there is no compulsion to select voltages only occurring across one of the resistors and it would be possible to select nonadjacent nodes, for example across two or three resistors as the voltages supplied to the output lines 60 and 62. Nevertheless, the arrangement shown in FIG. 4 is preferred as it guarantees a monotonic change in output voltage. In use, adjacent switches are closed and the remaining switches are held open thereby selecting voltages $V_{S(M)}$ and $V_{S(M+1)}$ corresponding to the voltages occurring across an arbitrary resistor in the resistor chain. These voltages are then supplied to a sub-ranging converter, generally designated 70. In use, a demand word to be converted is divided up such that the most significant bits of the demand word are used to control the primary converter and in particular the selector 4 of that converter. The least significant bits are used to control the sub-ranging converter. Where the sub-ranging converter has binary weighted voltage followers (as will be described later) the least significant bits may be used directly to control the sub-ranging converter. However, where the voltage follower transistors are not binary weighted, for example because multiple transistors are arranged to pass the same nominal current then some decoding of the least significant bits needs to be performed to control the sub-ranging converter 70.

The sub-ranging DAC 70 comprises a plurality of FET voltage followers 72, 74, 76 and 78. In the arrangement shown in FIG. 4 each voltage follower is the same. For simplicity only the voltage follower 78 will be described in detail. The voltage follower is of the same design as that described with respect to FIG. 3, and comprises a field effect transistor having its drain connected to a positive supply 80, its source connected via a series connected resistor 82 to a current sink 84, and an output formed at the node between the resistor 82 and the current sink 84. The gate of the field effect transistor 81 can be connected via electronically controllable switches 86 and 88 to either the output line 60 or the output line 62. Thus the gate can receive either the voltage $V_{S(M)}$ or the voltage $V_{S(M+1)}$.

The output nodes of the voltage followers are connected together to form a final output 90.

In the arrangement shown in FIG. 4 either all of the voltages followers 72, 74, 76 and 78 can be connected to the voltage $V_{S(M)}$ or alternatively three of them can be connected to voltage $V_{S(M)}$ and one connected to $V_{S(M+1)}$, two voltage followers can be connected to $V_{S(M)}$ and two connected to $V_{S(M+1)}$, one connected to $V_{S(M)}$ and three connected to $V_{S(M+1)}$ or all four could be connected to $V_{S(M+1)}$. As a consequence, the output voltages can be the sum of the voltage offset VF and voltages represented by $V_{S(M)}$, $V_{S(M+1/4)}$, $V_{S(M+1/2)}$ or $V_{S(M+3/4)}$. Thus the four field effect transistors provide an extra two bits of sub-ranging in the digital to analog converter. It will be seen that each voltage follower attains at the source of its respective transistor a value which corresponds to the input line 60 or 62 to which it has been connected, but that the resistors form the potential divider allowing these voltages to be summed, in this case, to an average voltage.

It follows that, for each of the voltage followers in the sub-ranging digital to analog converter 70, only one of the switches associated with the gate of any transistor can be closed at any one time. Both switches should not be simultaneously closed as this provides the short circuit path.

Figure 5:
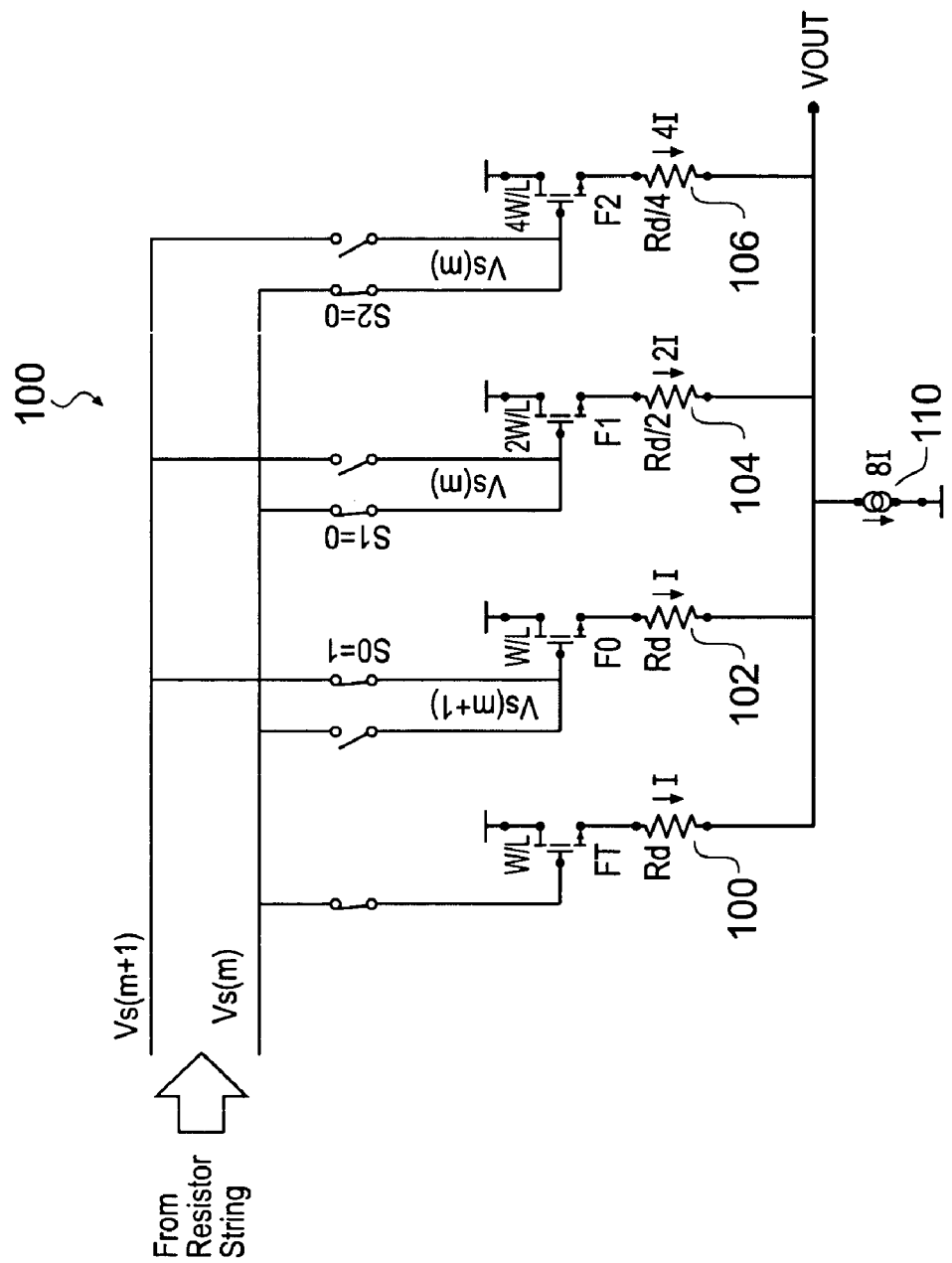
FIG. 5 is a schematic diagram of a sub-ranging converter constituting an embodiment of the present invention in which the transistors are binary weighed.

FIG. 5 shows a modified sub-ranging converter 100 whose basic configuration is identical to that of the sub-ranging converter 70 of FIG. 4. However the item shown in FIG. 5 has weighted contributions from the voltage followers. In this instance the series connected resistors 102, 104 and 106 of the voltage followers F0, F1 and F2 are binary weighted. Thus the value of the resistor 104 is half that of resistor 102 and the value of resistor 106 is half that of resistor 104. The transistors are similarly scaled such that the width to length ratio of the transistor in the follower F1 is twice that of the width to length ratio of the transistor in the follower F0, and similarly the width to length ratio of the transistor in the follower F2 is twice that of the width to length ratio of the transistor in the follower F1. A further follower, labelled FT is fabricated and, in this example, it is permanently switched to receive the voltage $V_{S(M)}$. In use, the follower FT passes a nominal current I. Similarly the follower F0 passes a nominal current I, whereas the follower F1 passes a current 2I and the follower F2 passes a current 4I. Thus the single current sink 110 is designed to pass a current 8I. In essence the sub-ranging converter in FIG. 5 works in the same way to that described in FIG. 4, except the contributions are now binary weighted and hence this sub-ranging converter can provide three bits of extra resolution although the followers need to be better matched in order to guarantee monotonicity.

Figure 6:
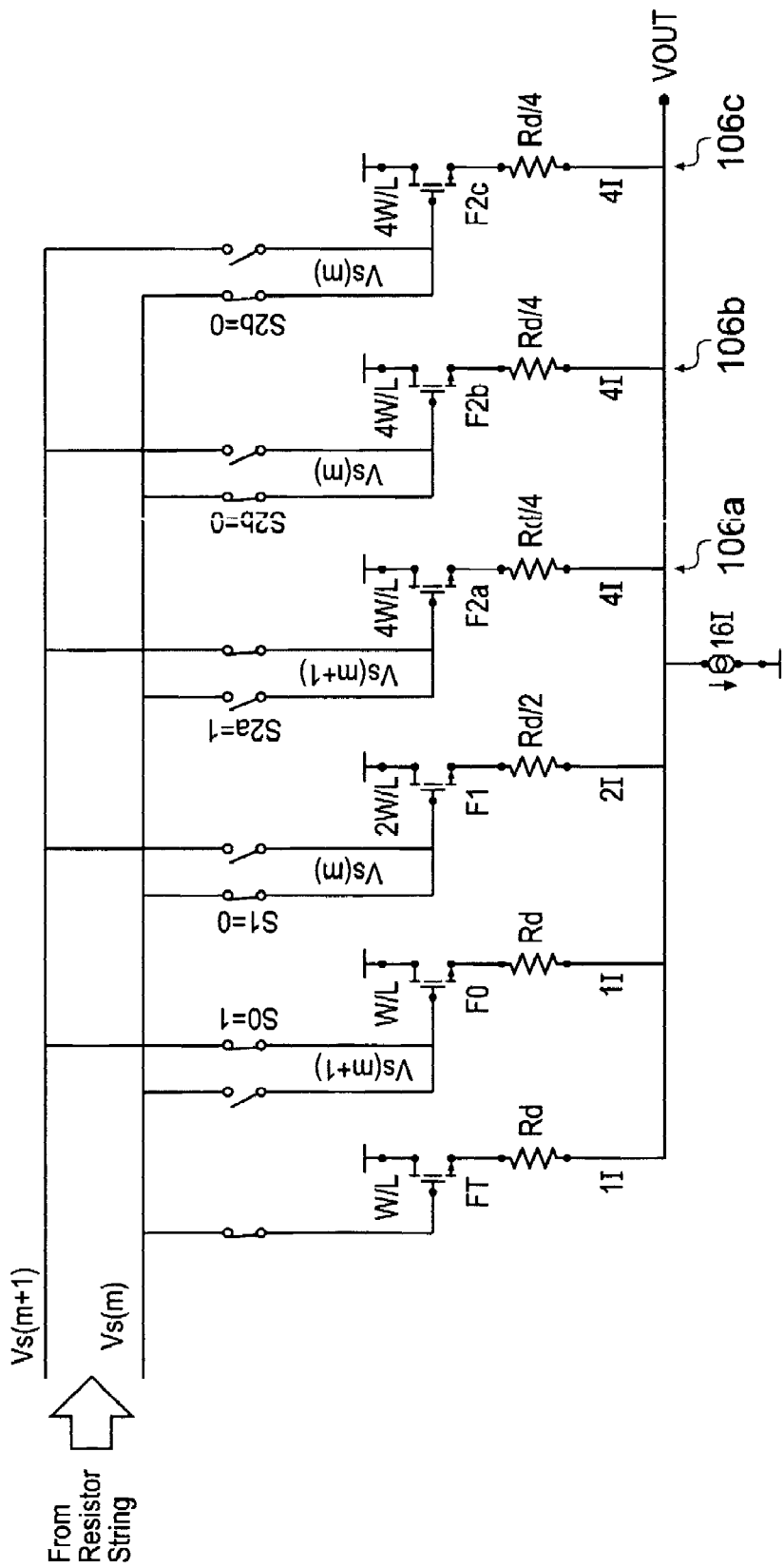
FIG. 6 is a schematic diagram of a further sub-ranging converter constituting an embodiment of the present invention.

FIG. 6 shows a further variant of the sub-ranging converter. As before a plurality of weighted voltage followers are provided, but now, instead of only one follower 106 having a nominal current 4I being provided, three voltage followers 106a, 106b and 106c are provided, each being fabricated to pass a current 4I. It can be seen that two of the voltage followers, for example 106b and 106c can be switched together pass a current of 8I and consequently can simulate a further binary weight. Thus the circuit shown in FIG. 6 can provide four bits of sub-ranging whilst ensuring components therein are only scaled by three bits, i.e. only 8 times. In this arrangement a four bit control word for the subconverter can be utilised such that the lowest two bits of the control word control the switches F0 and F1, whereas the most significant two bits are decoded to a number 0, 1, 2 and 3 and this is used to control the followers 106a, 106b and 106c.

It is clear that, since the sub-ranging converter does not draw any significant DC current from the resistor string because the high impedance of the field effect transistors, then a single string 2 can be shared across multiple converters, and each converter can comprise a selection unit 4, of the type described with respect to FIG. 4 and a sub-ranging converter of the type described with respect to FIGS. 4, 5 or 6. Such an arrangement is shown in FIG. 7.

Whilst the arrangement shown in FIG. 7 works well, it can still exhibit AC cross talk when one of the digital to analog converters is updated simply because the capacitive nature of a MOS gate means that current will need to be supplied or sunk by the resistor string in order to charge the gates of the voltage follower transistors to a new value each time a new word is set. It is likely that the cross talk problem is sufficiently small to be considered insignificant when only the lower most bits, i.e. those bits controlling the sub-ranging converter are changed, as opposed to those bits used to control the selector 4. However, for simplicity, it is easy to handle any change in the same way.

Figure 8:
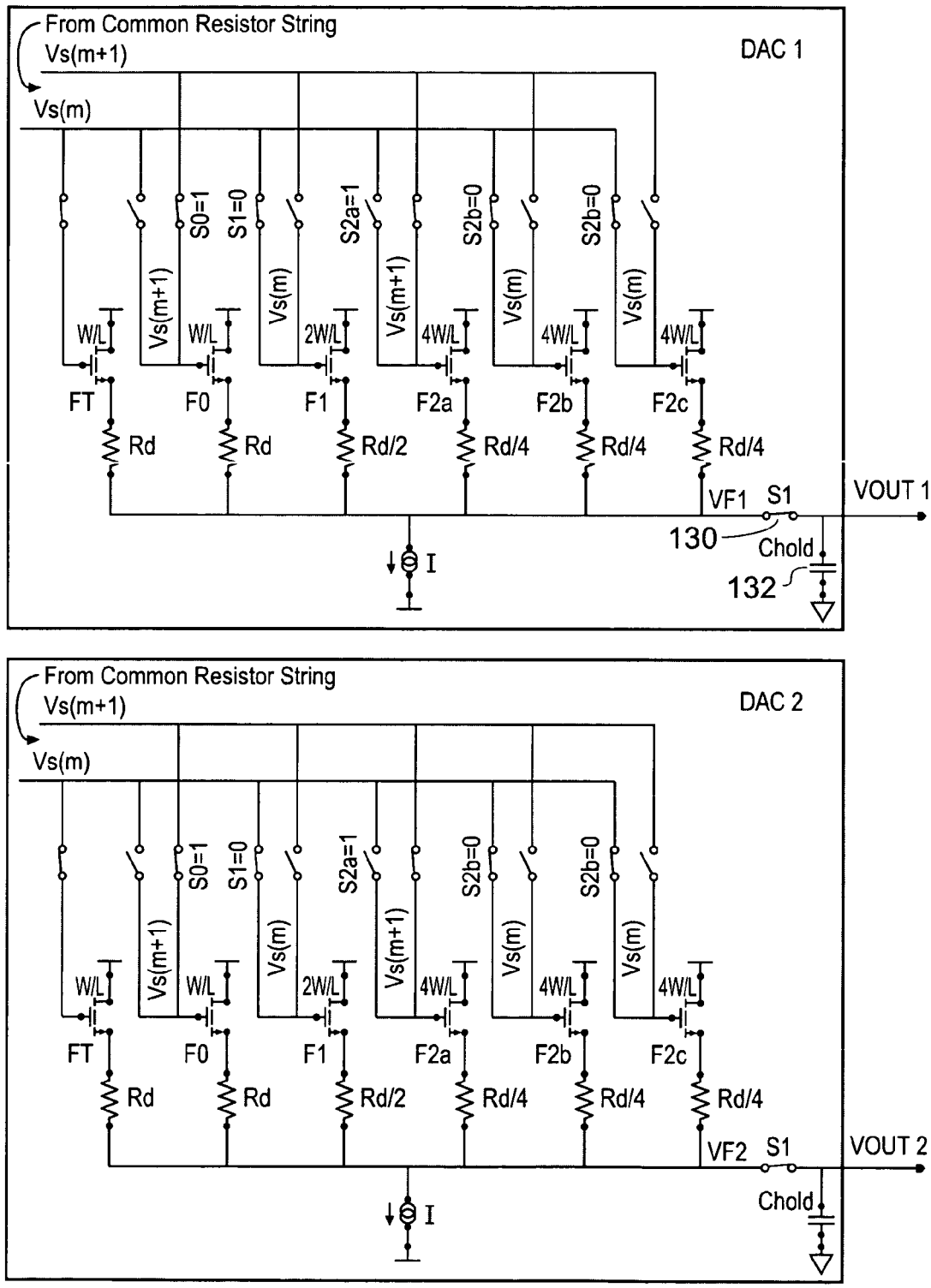
FIG. 8 schematically illustrates sub-ranging converters constituting embodiments of the present invention with associated track and hold circuits.

The problem of AC cross talk can be solved very simply by adding a track and hold circuit to the output of each sub-ranging converter. In FIG. 8 two converters DAC1 and DAC2 are illustrated, and only the sub-ranging sections of each of these converters are shown in detail, for clarity. The converters DAC1 and DAC2 are of the type described hereinbefore with reference to FIG. 6 and consequently do not need to be described further.

In each case track and hold comprising a switch 130 and a holding capacitor 132 is added in the signal path to the output. In general, the switch 130 is closed such that the capacitor 132 is charged to the output voltage of the digital to analog converter. However, when a new digital word for conversion is presented to the digital to analog converter, the switches 130 of each digital to analog converter are opened thereby causing the output voltage to be provided only by the charge stored on the capacitor 132. The new word to be converted is then processed such that the switches in the selection unit 4 and the sub-ranging converter of the digital to analog converter that is being updated are changed, and then a suitable guard period is allowed to pass before the switches 130 in each of the digital to analog converters are closed again. The guard period is selected to just sufficient to ensure that transients resulting from charging the parasitic capacitances of the transistors of the sub-ranging converter are substantially finished by the time the switches 130 are closed.

Figure 9:
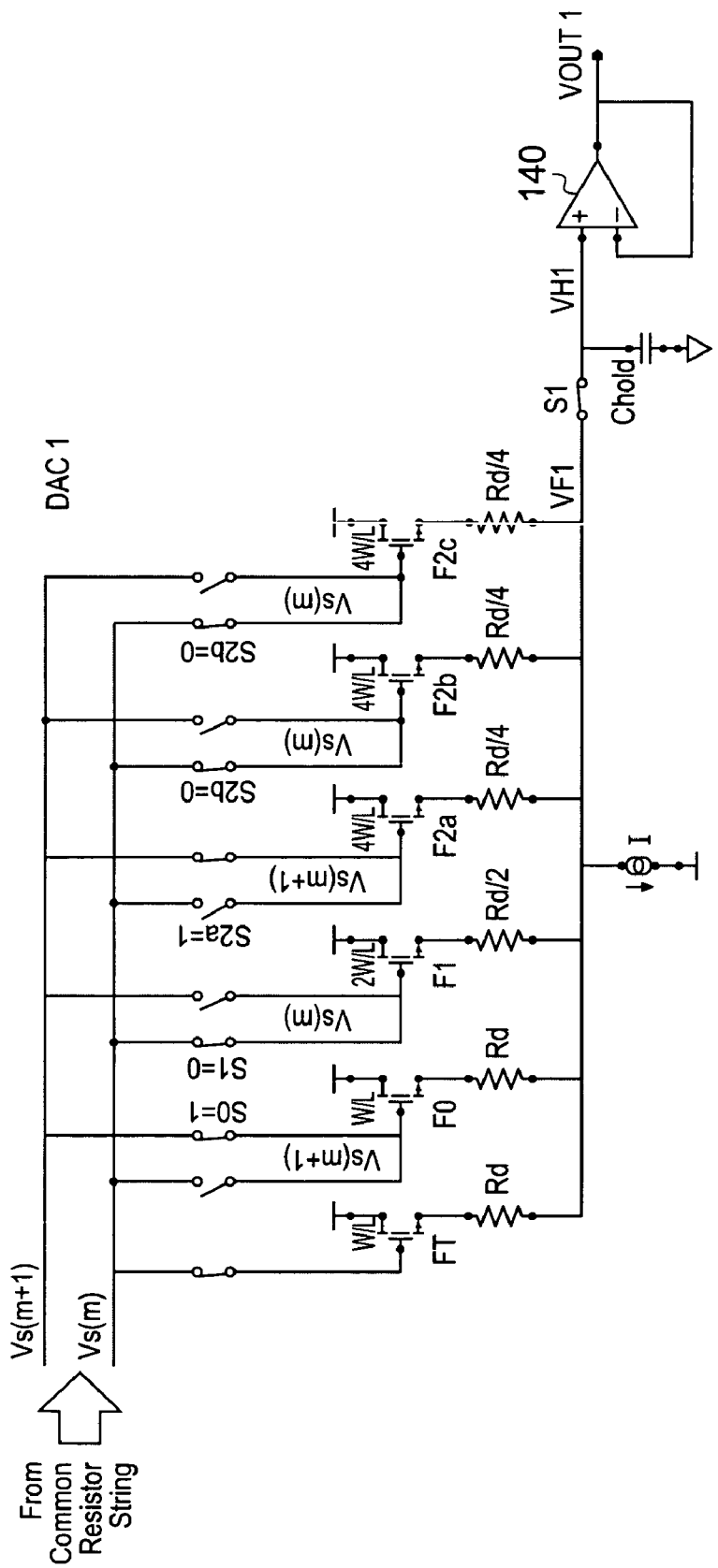
FIG. 9 shows a sub-ranging converter constituting an embodiment of the present invention in association with a unity gain buffer.
Figure 10:
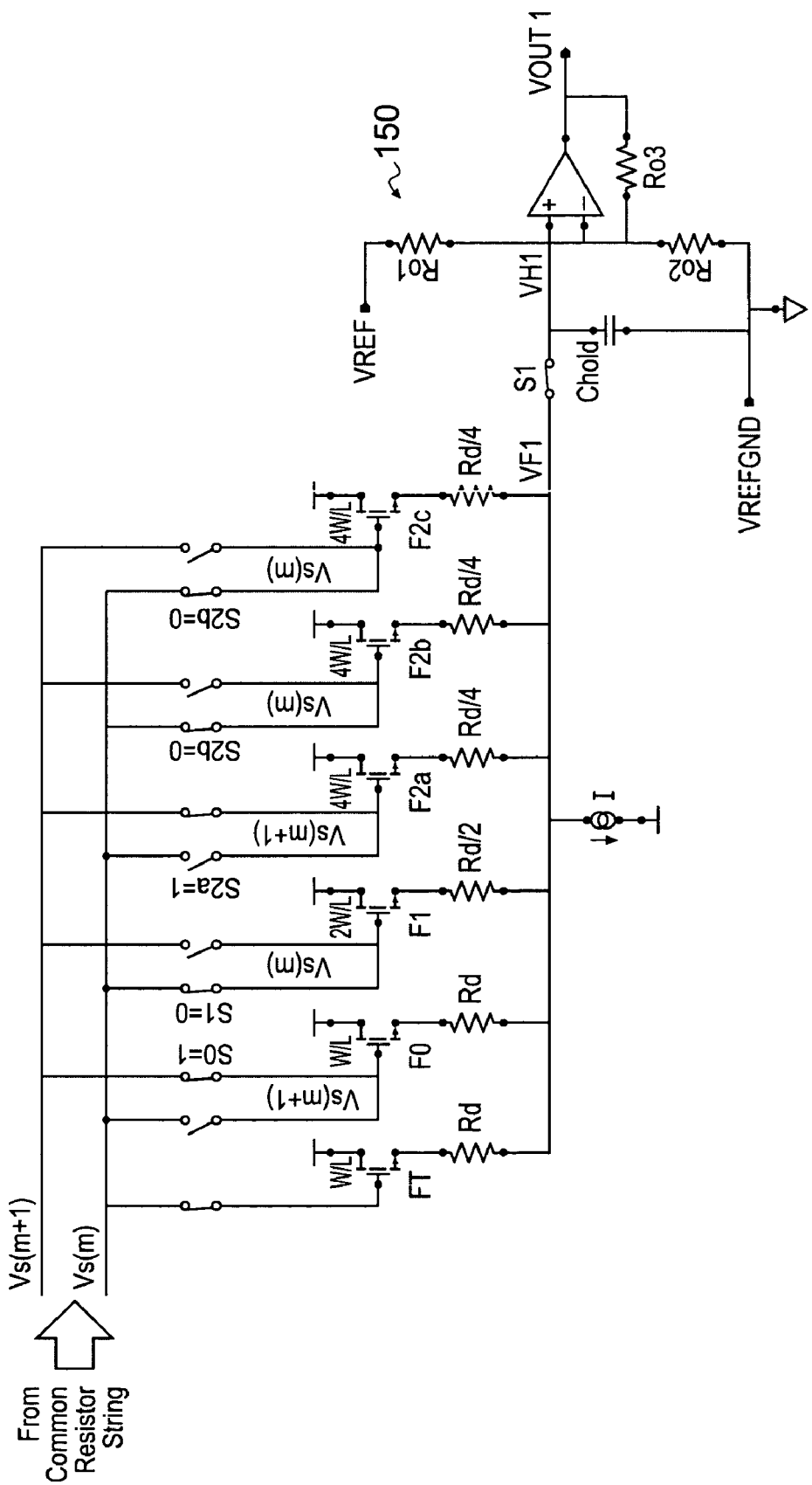
FIG. 10 shows a sub-ranging converter constituting an embodiment of the present invention in association with a buffer providing gain and offset adjustment.

The track and hold may be followed by a unity gain buffer 140, for example as shown in FIG. 9 or by a buffer 150 exhibiting gain and optionally offset as shown in FIG. 10.

In reality, each field effect transistor has a fourth terminal, mainly a "back gate". For the transistors in the sub-ranging converter, the back gates are preferably connected to the $V_{OUT}$ terminal.

The performance of the voltage followers can further be enhanced if the voltage difference between the drain and source of each device can be maintained substantially constant. Since the voltage followers have finite output impedance, the drain source voltage can have an effect on the voltage occurring at the source of the follower. This can be alleviated by using a modified follower circuit in which a further transistor is provided in series connection between positive supply and the drain terminal of the voltage follower transistor such that the further transistor can drop a variable voltage across it thereby holding the drain source voltage across the follower transistor substantially invariant. A suitable circuit for performing this function is shown in FIG. 11.

Figure 11:
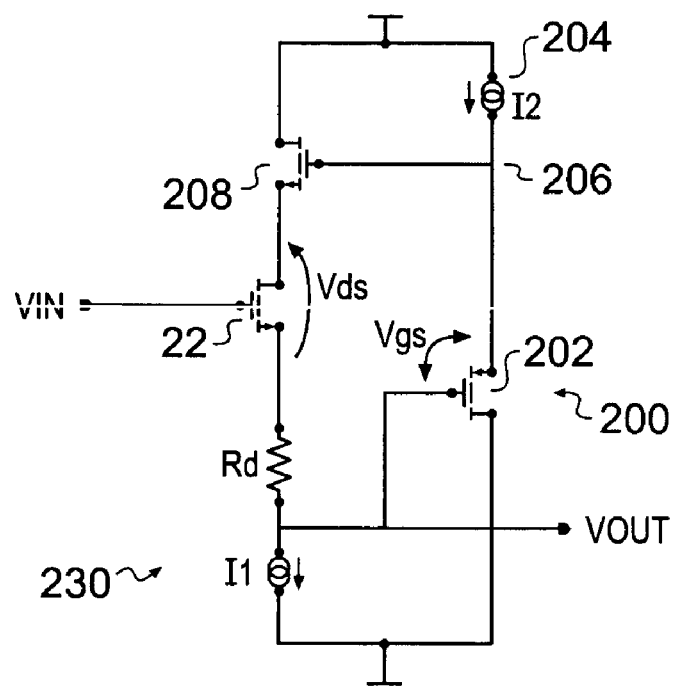
FIG. 11 shows a modified voltage follower circuit which can be used in any of the sub-ranging converters constituting an embodiment of the present invention.
Figure 12:
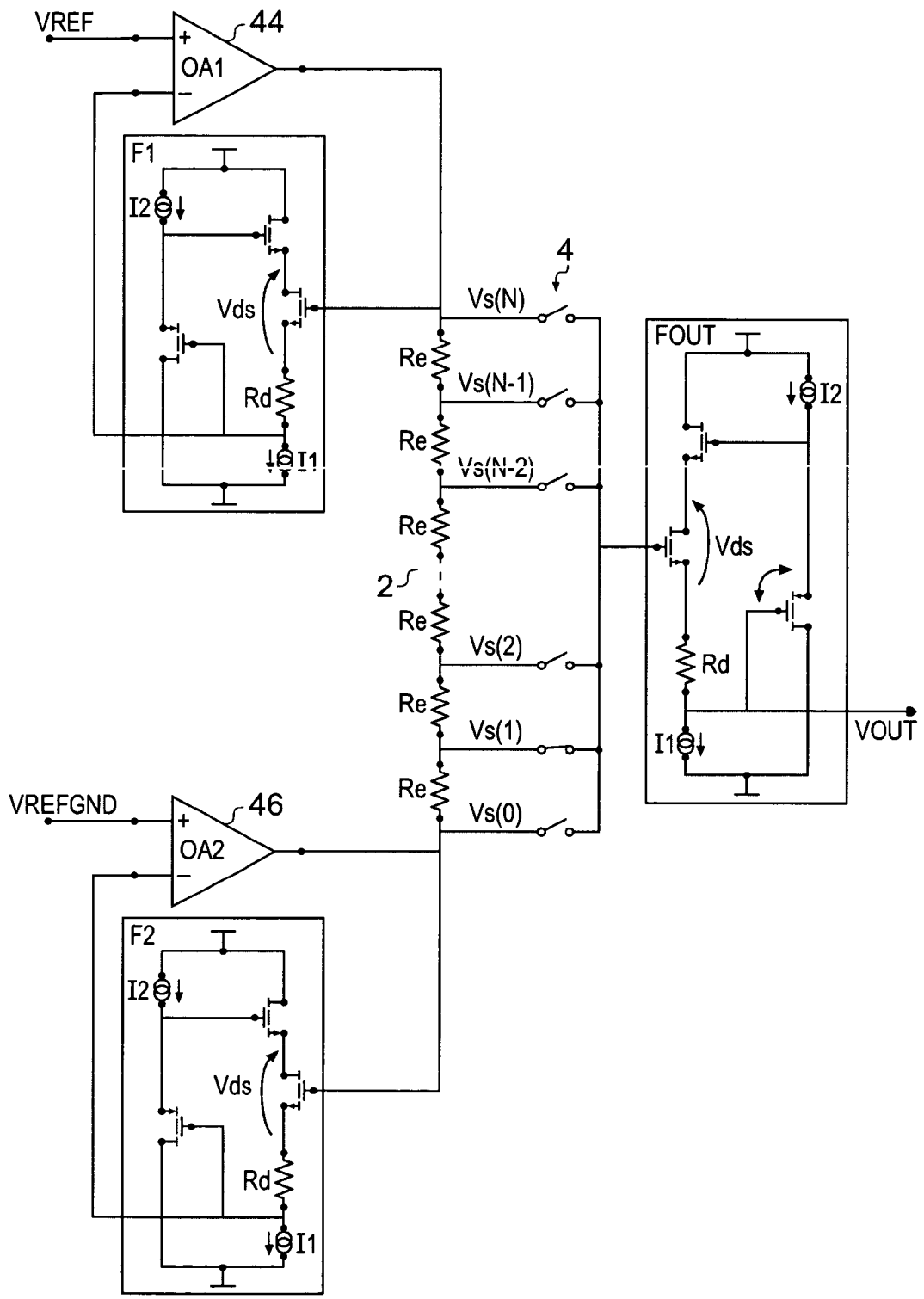
FIG. 12 shows the circuit of FIG. 3 when modified using the improved voltage follower shown in FIG. 11.

The circuit in FIG. 11 adds a voltage stabilisation circuit around the FET voltage follower. In order to do this a second voltage follower is constructed, generally indicated 200, and comprising a PMOS field effect transistor 202 with its gate connected to receive the output voltage $V_{OUT}$, and its source connected to receive current from a current source 204. Thus the voltage at a node 206 between the current source 204 and the source of the transistor 202 tracks the output voltage $V_{OUT}$ and is offset therefrom by the gate source voltage $V_{GS}'$ of the transistor 202. This voltage is provided to the gate of a third field effect transistor 208 which is connected so as to have its source connected to the positive rail and its drain connected to the source of the voltage follower transistor 22. Therefore the drain voltage at the transistor 22 effectively follows the output voltage $V_{OUT}$ and hence the drain source voltage across transistor 22 is substantially invariant. This enhanced voltage follower, generally designated 230 in FIG. 11 can be used in place of any of the more simple voltage followers, for example the followers 20, 40 and 42 in FIG. 3 thereby resulting in a circuit of a type shown in FIG. 12. Therefore, even though each follower is subjected to a different input voltage by virtue of the voltage appearing on the gate of the follower transistor, each follower transistor, 202 has a very similar drain source voltage, $V_{DS}$, which in turn reduces variation in the gate-source voltage and errors associated with its variation.

Figure 13:
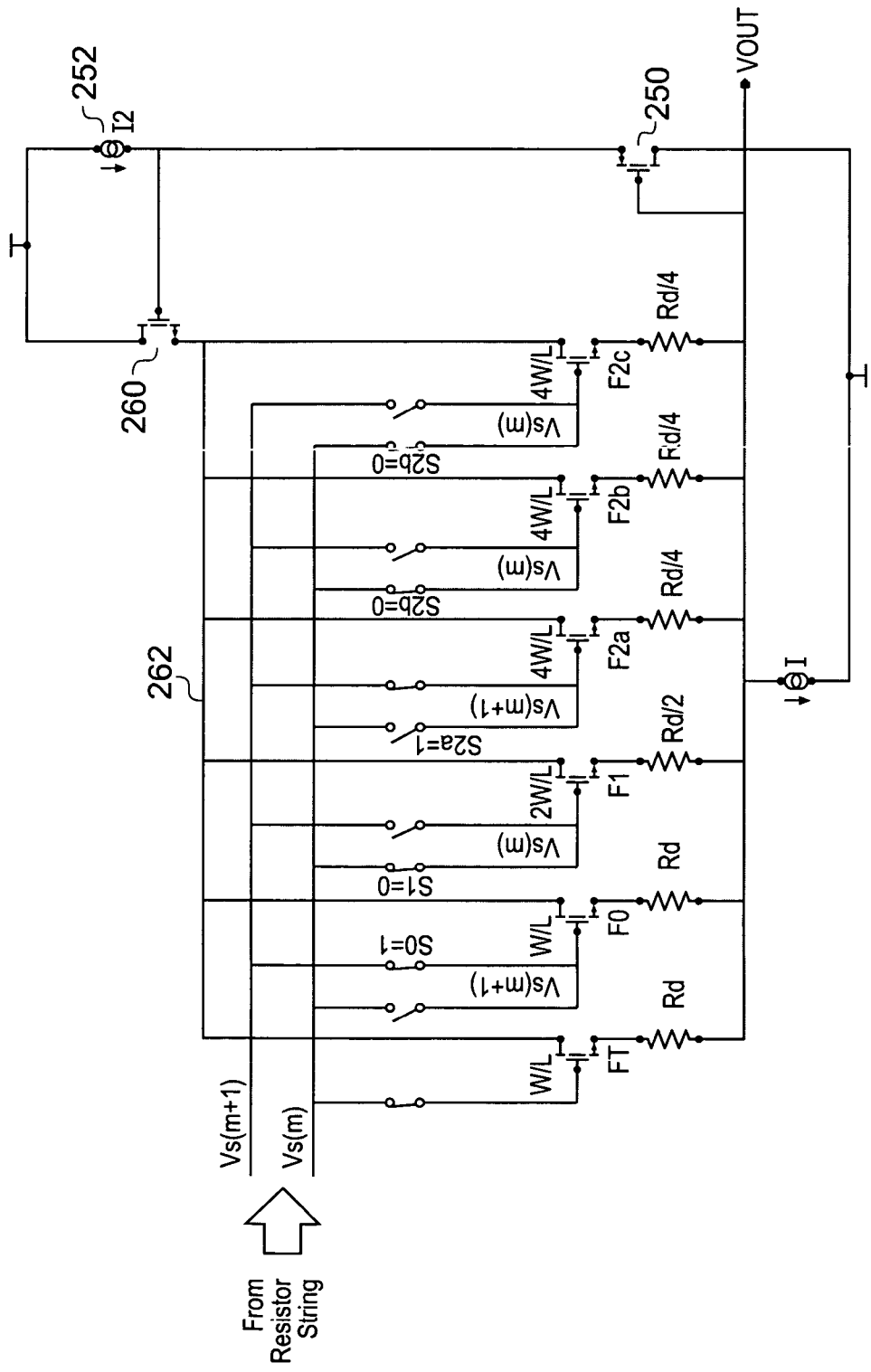
FIG. 13 shows a modified sub-ranging converter including drain-source voltage stabilisation and constituting an embodiment of the present invention.

This stabilisation of the drain-source voltage of the follower transistors can be applied to the followers within the sub-ranging digital to analog converter. Thus, the sub-ranging converter of the type shown in FIG. 6 can be modified, as shown in FIG. 13 by the provision of a PMOS field effect transistor 250 in series connection with a current source 252, having connections analogous to the transistor 202 and current source 204 described hereinbefore with respect to FIG. 11. Similarly the gate of the transistor 250 is connected to the output node of the circuit such that the source voltage at the transistor 250 tracks the output voltage. A further NMOS transistor 260 has its drain connected to a positive supply, and its gate connected to the source of the transistor 250 such that it forms a further voltage follower. A source of the transistor 260 is connected to a supply rail 262 which acts as the supply to the drain terminal of each of the voltage following transistors within the sub-ranging converter. Thus, the drain source voltage across each of the voltage follower transistors within the sub-ranging converter is effectively held invariant.

It was noted earlier on that the use of the FET voltage follower arrangement causes a voltage offset to be introduced into the digital to analog converter. This is generally undesirable and can be corrected for, as shown in FIG. 3, by using two further voltage followers to offset the voltage of the resistor string such that the combined offsets compensate one another. However, compensation can be performed in other ways and FIG. 14 illustrates an arrangement in which the voltages occurring across the resistor string are not shifted by a follower, but instead a voltage follower is included within a buffer circuit which buffers the output of the sub-ranging converter.

Figure 14:
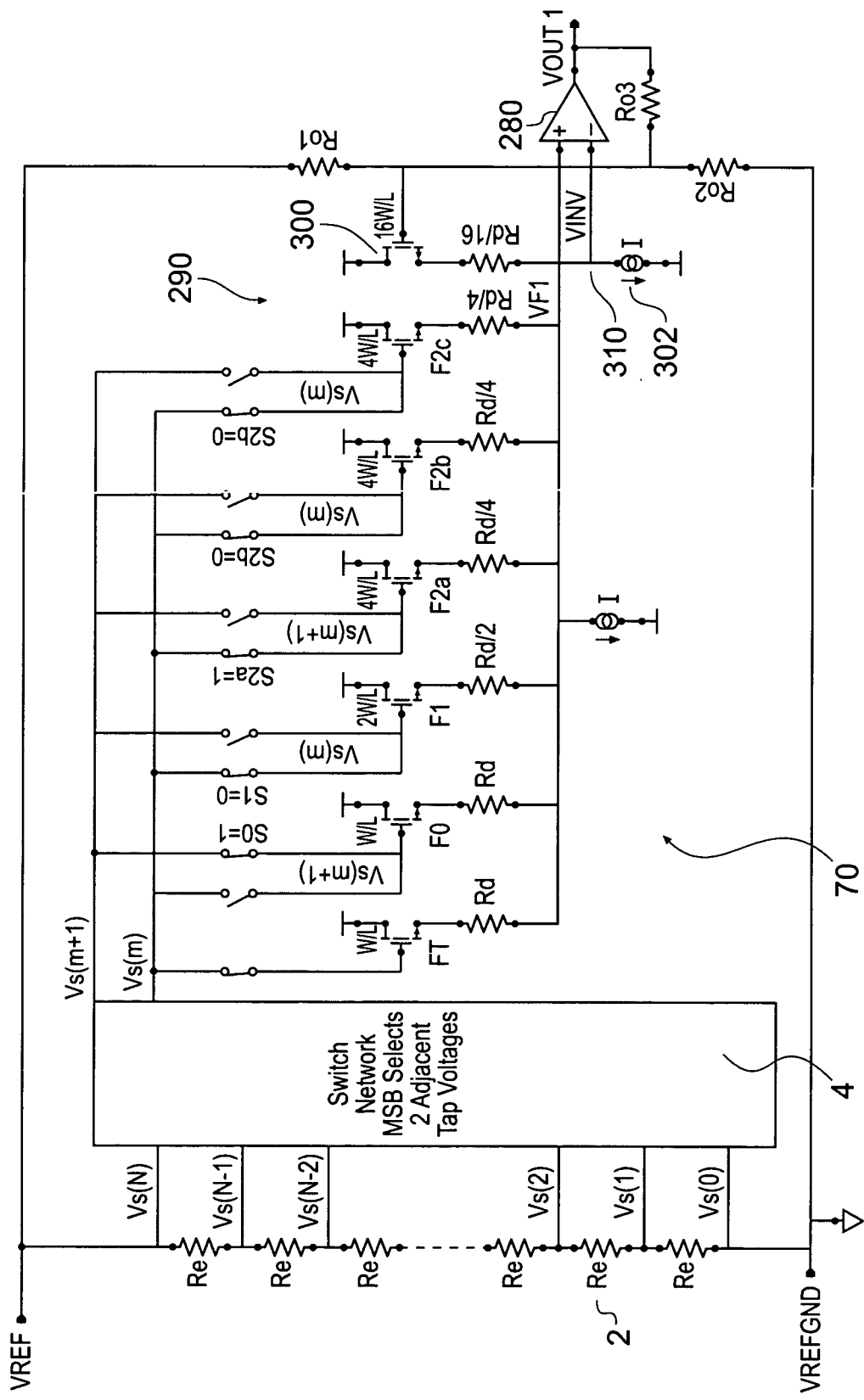
FIG. 14 shows a sub-ranging converter having an output buffer offset compensation.
Figure 15:
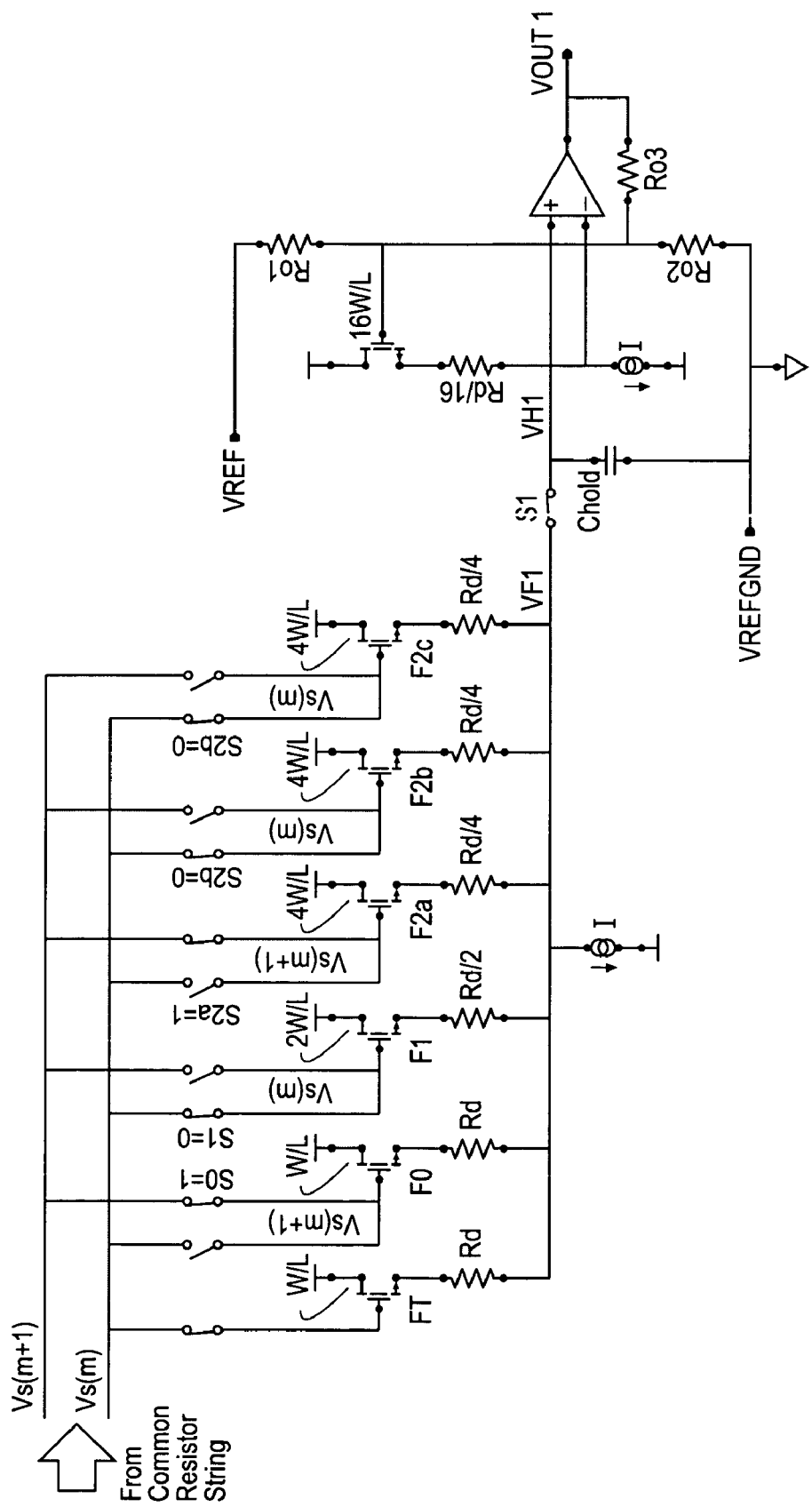
FIG. 15 shows the circuit of FIG. 14 with a track and hold function included.

The circuit as shown in FIG. 14 comprises a resistor chain 2 directly connected to the reference terminals $V_{REF}$ and $V_{REFGROUND}$. A switched network 4 selects adjacent taps within the resistor chain in order to provide voltages $V_{S(M)}$ and $V_{S(M+1)}$ to input lines of the sub-ranging converter. An output of the sub-ranging converter, labelled VF1, is provided to the non-inverting input of a buffer amplifier 280. Conventionally the amplifier 280 would be arranged as a non-inverting amplifier, having gain, and consequently two resistors 282 and 284 would be provided in series between the output $V_{OUT1}$ of the amplifier 280 and a local "ground" voltage which typically as in this example would be $V_{REF-GROUND}$. In order to complete the feedback loop the inverting input of the amplifier would be connected to the node between resistors 282 and 284. The operation of the amplifier would be to match the voltage at the inverting input to the voltage at its non-inverting input and consequently the amplifier would exhibit gain G of:

$$G = \frac{RO3}{RO3 + (RO1 \text{ in parallel with } RO2)}$$

where, in this example R1 corresponds to resistor 284, and R2 corresponds to resistor 282. However, in the arrangement shown in FIG. 14 a voltage offset needs to be provided to cancel out the voltage from the voltage from the voltage follower and consequently a further voltage follower 290 is provided which comprises a transistor 300 having its drain connected to a positive supply and its source connected to a current sink 302. The current sink 302 sink the same current as the current sink provided for the sub-ranging converter. The transistor 300 receives the voltage occurring at the node between resistors RO2 and RO3 and provides a voltage follower action such that a voltage at a node 310 follows a voltage at the node between resistors RO2 and RO3 but is offset by the follower voltage, which due to the nature of integrated circuits, can be fabricated to accurately match the voltage of the sub-ranging converters. Thus, the effect is that the feedback loop around the amplifier 280 is used to provide a voltage offset which cancels out the voltage offset resulting from the followers used within the sub-ranging converters. This circuit can also be used with the sample and hold circuit shown in FIG. 9 to produce the circuit shown in FIG. 15 which offers immunity from AC cross talk when a word is changed due to the ability to hold the output voltage from the local sub-ranging converter on the track and hold capacitor, whilst also providing buffering at the output of the digital to analog converter, again and cancellation of the offset voltage produced by virtue of the use of the voltage followers.

Figure 16:
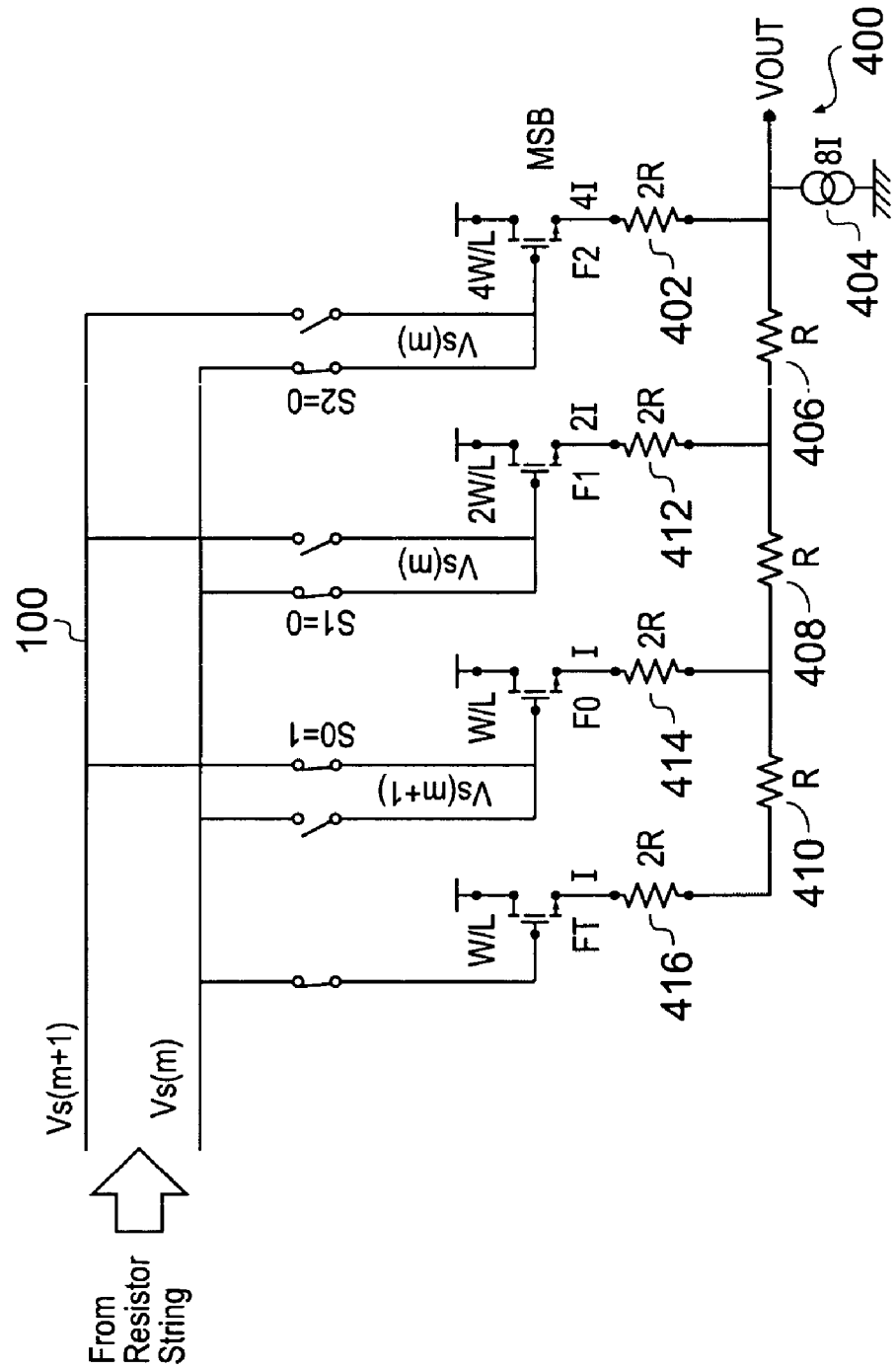
FIG. 16 illustrates a modified sub-ranging converter constituting an embodiment of the present invention.

FIG. 16 shows a modification to the sub-ranging converter of FIG. 5 and which allows for easier fabrication because only two resistor sizes are used, namely R and 2R and the 2R resistor can be fabricated by placing two of the R resistors in series. This configuration gives space savings on the silicon die, especially as the number of bits in the sub-ranging converter increases. Transistor F2 represents the most significant bit in the sub-ranging converter and, in this example, it is nominally arranged to pass a current 4I. Transistor F1 represents the next most significant bit and is nominally arranged to pass a current of 2I. Transistor F0 represents the least significant bit and is arranged to pass a current I and transistor FT is permanently connected and is also arranged to pass a current I. The transistors FT, F0, F1 and F2 are connected to an R-2R ladder, generally designated 400. The R-2R ladder divides the current flowing along the ladder in a binary manner. Thus, resistor 402 is in series connection with the source of transistor F2 and the output node $V_{OUT}$. The current sink 404 passing a nominal current 8I is also connected to the output node $V_{OUT}$. Resistors 406, 408 and 410, each having a value of R are arranged in series and connected to the output $V_{OUT}$. A resistor 412 having a value 2R is connected between the source of transistor F1 and a node formed between resistors 406 and 408. Similarly a resistor 414 having a value of 2R is connected between the source of transistor F0 and a node formed between resistors 408 and 410, and finally a resistor 416 having a value 2R is in series connection between source of transistor FT and resistor 410.

Therefore the impedance seen from the source of each transistor to the output node scales in a binary manner the least impedance being seen by the most significant bit transistor F2 and the most impedance being seen by the least significant transistor FT. The R-R2 ladder scales easily and could be applied to much larger sub-ranging converters.

It is thus possible to provide an analog to digital converter comprising a main converter and a sub-ranging converter which interpolates between the values provided to two outputs of the main converter, and where the sub-ranging converter uses voltage followers in order to present a high impedance to the primary converter whilst also occupying only a relative small area on the silicon die.

The invention claimed is:

1. A digital to analog converter, comprising:
   a first digital to analog converter for producing first and second outputs in response to a demand word; and at least one sub-ranging digital to analog converter having first and second inputs for receiving the first and second outputs from the first digital to analog converter;

wherein the at least one sub-ranging digital to analog converter comprises 1 to N voltage follower transistors, each voltage follower transistor having:

a) a respective first terminal connected to a shared output node of one of the sub-ranging converters; and b) a respective control terminal which is selectively connectable to the first input or the second input of the sub-ranging converter.

2. A digital to analog converter as claimed in claim 1, in which each voltage follower transistor is in series connection with a current defining device.

3. A digital to analog converter as claimed in claim 2, in which a resistor is in series connection between the first terminal of each voltage follower transistor and the current defining device.

4. A digital to analog converter as claimed in claim 3, in which the resistors are scaled in substantially inverse proportion to the relative nominal current flowing in the associated voltage follower transistor.

5. A digital to analog converter as claimed in claim 2, in which the transistors are connected to a shared current defining device.

6. A digital to analog converter as claimed in claim 2, in which the current defining device is one of a current source and a current sink.

7. A digital to analog converter as claimed in claim 3, in which the shared output node is formed at the connection between the current defining device and the resistor.

8. A digital to analog converter as claimed in claim 1, in which the voltage follower transistors of a given sub-ranging converter are arranged to pass nominally the same current as one another.

9. A digital to analog converter as claimed in claim 8, in which the sub-ranging converter is responsive to a least significant proportion of the demand word, and the least significant portion is decoded in a thermometer style to control selection switches associated with the voltage follower transistors.

10. A digital to analog converter as claimed in claim 1, wherein each voltage follower transistor further has a second terminal connected to a voltage supply.

11. A digital to analog converter as claimed in claim 10, in which the voltage follower transistors are field effect transistors, the first terminal is a source of the transistor, the second terminal is the drain of the transistor and the control terminal is the gate of the transistor.

12. A digital to analog converter as claimed in claim 1, in which the voltage follower transistors within a given sub-ranging converter are arranged to pass current in a scaled manner such that the currents are related by a geometric progression.

13. A digital to analog converter as claimed in claim 12, in which currents passed by the voltage follower transistors are binary weighted.

14. A digital to analog converter as claimed in claim 13, in which some binary values are repeated.

15. A digital to analog converter as claimed in claim 13, in which each voltage follower transistor has an impedance between its first terminal and the shared output node which is substantially in inverse proportion to a nominal current passed by that transistor.

16. A digital to analog converter as claimed in claim 15 in which the transistors of the sub-ranging converter are connected to a current division network.

17. A digital to analog converter as claimed in claim 16 in which the current division network is an K-2R ladder.

18. A digital to analog converter as claimed in claim 1, in which each transistor further has a second terminal for receiving a supply and at least one of the sub-ranging digital to analog converters further includes a voltage stabilisation circuit that tracks the voltage applied to the second terminals of the voltage follower transistors with respect to the voltage at the output.

19. A digital to analog converter as claimed in claim 18, in which each voltage follower transistor has its own stabilisation circuit.

20. A digital to analog converter as claimed in claim 18, in which a stabilisation circuit is shared between the voltage follower transistors of a sub-ranging converter.

21. A digital to analog converter as claimed in claim 1, further including at least one offset compensation circuit for compensating for a voltage offset introduced by the voltage followers of the sub-ranging digital to analog converter.

22. A digital to analog converter as claimed in claim 21, in which the output of the sub-ranging converter is offset by a further voltage follower.

23. A digital to analog converter as claimed in claim 21, in which the output of the sub-ranging converter is offset by a buffer amplifier.

24. A digital to analog converter as claimed in claim 21, in which offset compensation circuits are associated with the resistor string of the primary converter such that the voltage output from the primary converter is offset.

25. A digital to analog converter as claimed in claim 1, further including a track and hold circuit operable to hold the output of the digital to analog converter.

26. A digital to analog converter as claimed in claim 1, comprising a plurality of channels and wherein the first digital to analog converters of at least two of the channels share a voltage divider string.

27. A digital to analog converter as claimed in claim 26, wherein at least one of the channels further comprises a track and hold circuit, and a controller causes the track and hold circuit to hold the output voltage during an update of another one of the channels.

* * * * *

UNITED STATES PATENT AND TRADEMARK OFFICE
CERTIFICATE OF CORRECTION

| | |
|---|---|
| PATENT NO. | : 7,015,847 B1 |
| APPLICATION NO. | : 11/056876 |
| DATED | : March 21, 2006 |
| INVENTOR(S) | : Roderick C. McLachlan et al. |

It is certified that error appears in the above-identified patent and that said Letters Patent is hereby corrected as shown below:

In Claim 17, column 14, line 13, change "K-2R" to --R-2R--.

Signed and Sealed this

Fifth Day of December, 2006

JON W. DUDAS
*Director of the United States Patent and Trademark Office*